(12) United States Patent
Liang et al.

(10) Patent No.: US 10,170,503 B2
(45) Date of Patent: Jan. 1, 2019

(54) THIN FILM TRANSISTOR ARRAY SUBSTRATE AND LIQUID CRYSTAL PANEL

(71) Applicant: Wuhan China Star Optoelectronics Techology Co., Ltd, Wuhan, Hubei (CN)

(72) Inventors: Bo Liang, Guangdong (CN); Xuanyun Wang, Guangdong (CN)

(73) Assignee: Wuhan China Star Optoelectronics Technology Co., Ltd, Wuhan, Hubei (CN)

( * ) Notice: Subject to any disclaimer, the term of this patent is extended or adjusted under 35 U.S.C. 154(b) by 137 days.

(21) Appl. No.: 15/118,870

(22) PCT Filed: Jul. 21, 2016

(86) PCT No.: PCT/CN2016/090886
§ 371 (c)(1),
(2) Date: Aug. 13, 2016

(87) PCT Pub. No.: WO2017/219432
PCT Pub. Date: Dec. 28, 2017

(65) Prior Publication Data
US 2018/0166472 A1 Jun. 14, 2018

(30) Foreign Application Priority Data
Jun. 21, 2016 (CN) .......................... 2016 1 0452464

(51) Int. Cl.
*H01L 27/12* (2006.01)
*G02F 1/1368* (2006.01)
(Continued)

(52) U.S. Cl.
CPC ........ *H01L 27/1251* (2013.01); *G02F 1/1368* (2013.01); *H01L 27/1225* (2013.01);
(Continued)

(58) Field of Classification Search
None
See application file for complete search history.

(56) References Cited

U.S. PATENT DOCUMENTS 7,465,957 B2 * 12/2008 Arao ................. G02F 1/136209
257/59
2012/0305910 A1 12/2012 Hsieh
(Continued)

*Primary Examiner* — Michelle Mandala
(74) *Attorney, Agent, or Firm* — Andrew C. Cheng

(57) ABSTRACT

The present disclosure discloses a thin film transistor array substrate and a liquid crystal panel. The thin film transistor array substrate comprises a substrate, a silicon thin film transistor formed on the substrate, an oxide semiconductor transistor, and a capacitor. Wherein, the silicon thin film transistor and the oxide semiconductor transistor have a top gate structure, which is compatible with the manufacturing process of the silicon thin film transistor and the oxide semiconductor transistor, so that it can reduce the use frequency of the photoresist mask, and then reduce the production cost of the thin film transistor array substrate. In addition, the capacitor and the silicon thin film transistor or the capacitor and the oxide semiconductor transistor are overlapping arrangement, which can greatly increase the aperture ratio of the bottom emitting OLED.

18 Claims, 2 Drawing Sheets

(51) Int. Cl.
  *H01L 27/32* (2006.01)
  *H01L 21/28* (2006.01)
  *H01L 29/786* (2006.01)
  *H01L 29/788* (2006.01)
(52) U.S. Cl.
  CPC ...... *H01L 27/1255* (2013.01); *H01L 27/1288* (2013.01); *H01L 27/3262* (2013.01); *H01L 21/28273* (2013.01); *H01L 27/3265* (2013.01); *H01L 29/788* (2013.01); *H01L 29/7869* (2013.01); *H01L 29/78675* (2013.01)

(56) References Cited

U.S. PATENT DOCUMENTS

| | | |
|---|---|---|
| 2015/0054799 A1 | 2/2015 | Chang |
| 2015/0055051 A1* | 2/2015 | Osawa ................ H01L 27/1225 349/48 |
| 2015/0325602 A1 | 11/2015 | Im |
| 2017/0141172 A1* | 5/2017 | Cho ........................ H01L 51/56 |

* cited by examiner

THIN FILM TRANSISTOR ARRAY SUBSTRATE AND LIQUID CRYSTAL PANEL

BACKGROUND OF THE INVENTION

1. Field of the Invention

The present disclosure relates to the fields of liquid crystal display technology, and in particular to a thin film transistor array substrate and a liquid crystal panel.

2. The Related Arts

Organic light-emitting diode (OLED) display is an emerging flat-panel display. It has the advantages of the self-luminous, high contrast, thin, wide viewing angle, fast response, able for flexible display panels, and etc. Therefore, it has a very good development prospects.

OLED is a self-luminous display. Currently, the more mature technology is using low temperature poly silicon (LTPS) to manufacture the semiconductor layer of PMOS region and the NMOS region in CMOS circuits to drive the OELD display. Wherein, during the process of manufacturing the CMOS circuits using LTPS, it requires at least 9 times photoresist mask and at least 4 times doping processes (P-type ion doping, n-type ion doping, LDD doping and Ch doping). The production process is complex, and the cost of production is higher.

At the same time, in LTPS technology, because the carrier mobility of the polycrystalline silicon (poly Si) is large, it leads to the off current (Ioff) is larger, which easily leads to the formation of an image sticking. At the same time, large off current requires less W/L value. Therefore, the gate length value (L value) in the thin film transistor (TFT) is too large, the gate width (W value) too small. Currently, more S-type results in the increase of the TFT area of the active area (AA region), leading to decrease in aperture ratio.

Therefore, how to implement a thin film transistor array substrate with simple process and high opening rate for driving the OELD display is a serious problem.

SUMMARY OF THE INVENTION

The technical issue to be solved by the present disclosure is to provide a thin film transistor array substrate and a liquid crystal panel, which can manufacture the thin film transistor array substrate used for driving the OLED display with high aperture ratio in a relatively simple manufacturing process.

To solve the above technical problem, one aspect of the present disclosure is to provide a thin film transistor array substrate, comprising: a substrate, a silicon thin film transistor formed on the substrate, an oxide semiconductor transistor, and a capacitor; the silicon thin film transistor and the oxide semiconductor transistor having a top gate structure; the capacitor and the silicon thin film transistor or the capacitor and the oxide semiconductor transistor being overlapping arrangement; wherein, the thin film transistor array substrate comprises: a polysilicon layer and a semiconductor oxide layer provided and spaced on the substrate; a gate insulating layer covering the polysilicon layer and the semiconductor oxide layer; a first gate, a first metal layer, and a second gate provided and spaced on the gate insulating layer, the first gate being provided on the polysilicon layer, the second gate being provided on the semiconductor oxide layer; an etch stop layer covering the first gate, the first metal layer, and the second gate, the etch stop layer comprising a first insulating layer and a second insulating layer provided by stacking; a source-drain metal layer provided on the etch stop layer, the source-drain metal layer comprising a first source, a first drain, a second source, and a second drain, the first source and the first drain being respectively contacted with the polysilicon layer, the second source and the second drain being respectively contacted with the semiconductor oxide layer; wherein, the polysilicon layer, the gate insulating layer, the first gate, the etch stop layer, the first source, and the first drain form the silicon thin film transistor; the semiconductor oxide layer, the gate insulating layer, the second gate, the etch stop layer, the second source, and the second drain form the oxide semiconductor transistor; wherein, the silicon thin film transistor further comprises a floating gate; wherein, the floating gate is provided between the first insulating layer and the second insulating layer, the floating gate is located on the first gate; wherein, the first gate and the second gate are formed using the same mask process.

Wherein, the thin film transistor array substrate comprises a second metal layer, the second metal layer is formed from a part of the first drain; wherein, the first metal layer is located on the polysilicon layer; wherein, the first metal layer, the etch stop layer, and the second metal layer form the capacitor.

To solve the above technical problem, another aspect of the present disclosure is to provide a thin film transistor array substrate, comprising: a substrate, a silicon thin film transistor formed on the substrate, an oxide semiconductor transistor, and a capacitor; the silicon thin film transistor and the oxide semiconductor transistor having a top gate structure; the capacitor and the silicon thin film transistor or the capacitor and the oxide semiconductor transistor being overlapping arrangement.

Wherein, the thin film transistor array substrate comprises: a polysilicon layer and a semiconductor oxide layer provided and spaced on the substrate; a gate insulating layer covering the polysilicon layer and the semiconductor oxide layer; a first gate, a first metal layer, and a second gate provided and spaced on the gate insulating layer, the first gate being provided on the polysilicon layer, the second gate being provided on the semiconductor oxide layer; an etch stop layer covering the first gate, the first metal layer, and the second gate, the etch stop layer comprising a first insulating layer and a second insulating layer provided by stacking; a source-drain metal layer provided on the etch stop layer, the source-drain metal layer comprising a first source, a first drain, a second source, and a second drain, the first source and the first drain being respectively contacted with the polysilicon layer, the second source and the second drain being respectively contacted with the semiconductor oxide layer; wherein, the polysilicon layer, the gate insulating layer, the first gate, the etch stop layer, the first source, and the first drain form the silicon thin film transistor; the semiconductor oxide layer, the gate insulating layer, the second gate, the etch stop layer, the second source, and the second drain form the oxide semiconductor transistor.

Wherein, the silicon thin film transistor further comprises a floating gate, the floating gate is provided between the first insulating layer and the second insulating layer, the floating gate is located on the first gate.

Wherein, the thin film transistor array substrate comprises a second metal layer, the second metal layer is formed from a part of the first drain; wherein, the first metal layer is located on the polysilicon layer; wherein, the first metal layer, the etch stop layer, and the second metal layer form the capacitor.

Wherein, the thin film transistor array substrate comprises a third metal layer, the third metal layer is provided between the first insulating layer and the second insulating layer and located on the second gate; wherein, the second gate, the first insulating layer, and the third metal layer form the capacitor.

Wherein, the first metal layer is located between the polysilicon layer and the semiconductor oxide layer, the first metal layer is contacted with the first drain.

Wherein, the floating gate and the third metal layer are formed using the same mask process.

Wherein, the first gate and the second gate are formed using the same mask process.

Wherein, the thin film transistor array substrate further comprises a buffer layer; wherein, the buffer layer is provided on the substrate; wherein, the polysilicon layer and the semiconductor oxide layer are provided and spaced on the buffer layer.

To solve the above technical problem, another aspect of the present disclosure is to provide liquid crystal panel, comprising a thin film transistor array substrate; the thin film transistor array substrate comprising: a substrate, a silicon thin film transistor formed on the substrate, an oxide semiconductor transistor, and a capacitor; the silicon thin film transistor and the oxide semiconductor transistor having a top gate structure; the capacitor and the silicon thin film transistor or the capacitor and the oxide semiconductor transistor being overlapping arrangement.

Wherein, the thin film transistor array substrate comprises: a polysilicon layer and a semiconductor oxide layer provided and spaced on the substrate; a gate insulating layer covering the polysilicon layer and the semiconductor oxide layer; a first gate, a first metal layer, and a second gate provided and spaced on the gate insulating layer, the first gate being provided on the polysilicon layer, the second gate being provided on the semiconductor oxide layer; an etch stop layer covering the first gate, the first metal layer, and the second gate, the etch stop layer comprising a first insulating layer and a second insulating layer provided by stacking; a source-drain metal layer provided on the etch stop layer, the source-drain metal layer comprising a first source, a first drain, a second source, and a second drain, the first source and the first drain being respectively contacted with the polysilicon layer, the second source and the second drain being respectively contacted with the semiconductor oxide layer; wherein, the polysilicon layer, the gate insulating layer, the first gate, the etch stop layer, the first source, and the first drain form the silicon thin film transistor; the semiconductor oxide layer, the gate insulating layer, the second gate, the etch stop layer, the second source, and the second drain form the oxide semiconductor transistor.

Wherein, the silicon thin film transistor further comprises a floating gate; wherein, the floating gate is provided between the first insulating layer and the second insulating layer, the floating gate is located on the first gate.

Wherein, the thin film transistor array substrate comprises a second metal layer, the second metal layer is formed from a part of the first drain; wherein, the first metal layer is located on the polysilicon layer; wherein, the first metal layer, the etch stop layer, and the second metal layer form the capacitor.

Wherein, the thin film transistor array substrate comprises a third metal layer, the third metal layer is provided between the first insulating layer and the second insulating layer and located on the second gate; wherein, the second gate, the first insulating layer, and the third metal layer form the capacitor.

Wherein, the first metal layer is located between the polysilicon layer and the semiconductor oxide layer, the first metal layer is contacted with the first drain.

Wherein, the floating gate and the third metal layer are formed using the same mask process.

Wherein, the first gate and the second gate are formed using the same mask process.

Wherein, the thin film transistor array substrate further comprises a buffer layer; wherein, the buffer layer is provided on the substrate; wherein, the polysilicon layer and the semiconductor oxide layer are provided and spaced on the buffer layer.

The benefits of the present disclosure are as follows. Distinguish from the prior art, the thin film transistor array substrate and the liquid crystal panel according to the present disclosure comprises a substrate, a silicon thin film transistor formed on the substrate, an oxide semiconductor transistor, and a capacitor. Wherein, the silicon thin film transistor and the oxide semiconductor transistor have a top gate structure, which is compatible with the manufacturing process of the silicon thin film transistor and the oxide semiconductor transistor, so that it can reduce the use frequency of the photoresist mask, and then reduce the production cost of the thin film transistor array substrate. In addition, the capacitor and the silicon thin film transistor or the capacitor and the oxide semiconductor transistor are overlapping arrangement, which can greatly increase the aperture ratio of the bottom emitting OLED.

DETAILED DESCRIPTION OF THE PREFERRED EMBODIMENTS

The detailed descriptions accompanying drawings and the embodiment of the present invention are as follows.

Figure 1:
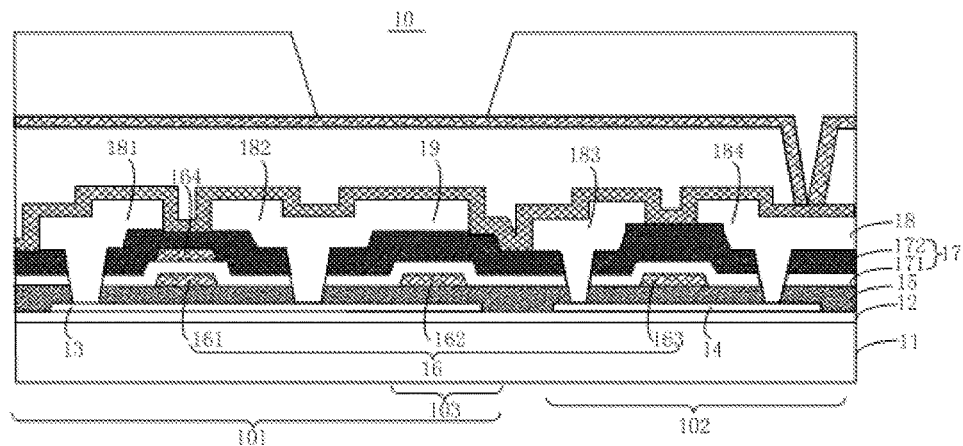
FIG. 1 is a schematic structure of the thin film transistor array substrate according to the first embodiment of the present disclosure.

FIG. 1 is a schematic structure of the thin film transistor array substrate according to the first embodiment of the present disclosure. As shown in FIG. 1, the thin film transistor array substrate 10 comprises a substrate 11, a silicon thin film transistor 101 formed on the substrate 11, an oxide semiconductor transistor 102, and a capacitor 103.

Wherein, the silicon thin film transistor 101 and the oxide semiconductor transistor 102 have a top gate structure, and the silicon thin film transistor 101 and the capacitor 103 are overlapping arrangement.

Wherein, the silicon thin film transistor 101 can be LTPS transistor, the oxide semiconductor transistor 102 can be IGZO transistor. In the present embodiment, the silicon thin film transistor 101 is a P-channel device (i.e. a PMOS transistor), and the oxide semiconductor transistor 102 is an N-channel device (i.e. an NMOS transistor). The silicon thin film transistor 101 combines with the oxide semiconductor transistor 102 to form a CMOS circuit to drive the OLED display. Wherein, the silicon thin film transistor 101 acts as driving transistor, and the oxide semiconductor transistor 102 acts as switching transistor.

Specifically, the thin film transistor array substrate 10 sequentially comprises a substrate 11, a buffer layer 12, a polysilicon layer 13, a semiconductor oxide layer 14, a gate insulating layer 15, a gate metal layer 16, a etch stop layer 17, and a source-drain metal layer 18.

The buffer layer 12 is provided on the substrate 11. The polysilicon layer 13 and the semiconductor oxide layer 14 are provided and spaced on the buffer layer 12. Preferably, the polysilicon layer 13 is made of polycrystalline silicon (poly Si), and the semiconductor oxide layer 14 is made of indium gallium zinc oxide (IGZO). In the other embodiment, the thin film transistor array substrate 10 may not include the buffer layer 12. At this time, the polysilicon layer 13 and the semiconductor oxide layer 14 are provided and spaced on the substrate 11.

The gate insulating layer 15 covers the polysilicon layer 13 and the semiconductor oxide layer 14.

The gate metal layer 16 is provided on the gate insulating layer 15. Wherein, the gate metal layer 16 comprises a first gate 161, a first metal layer 162, and a second gate 163 provided and spaced on the gate insulating layer 15. Wherein, the first gate 161 is provided on the polysilicon layer 13, the second gate 163 is provided on the semiconductor oxide layer 14. Preferably, the first gate 161, the first metal layer 162, and the second gate 163 are formed using the same mask process. Preferably, the gate metal layer 16 is made of germanium (GE).

The etch stop layer 17 covers the first gate 161, the first metal layer 162, and the second gate 163. Wherein, the etch stop layer 17 comprises a first insulating layer 171 and a second insulating layer 172 provided by stacking. Preferably, the first insulating layer 171 is made of silicon nitride (SiN), and the second insulating layer 172 is made of silicon oxide (SiO).

The source-drain metal layer 18 is provided on the etch stop layer 17. The source-drain metal layer comprises a first source 181, a first drain 182, a second source 183, and a second drain 184. Wherein, the first source 181 and the first drain 182 are respectively contacted with the polysilicon layer 13, the second source 183 and the second drain 184 are respectively contacted with the semiconductor oxide layer 14.

Wherein, the polysilicon layer 13, the gate insulating layer 15, the first gate 161, the etch stop layer 17, the first source 181, and the first drain 182 form the silicon thin film transistor 101; the semiconductor oxide layer 14, the gate insulating layer 15, the second gate 163, the etch stop layer 17, the second source 183, and the second drain 184 form the oxide semiconductor transistor 102.

Preferably, in order to improve the gate control of the silicon thin film transistor 101, the silicon thin film transistor 101 further comprises a floating gate 164. The floating gate 164 is provided between the first insulating layer 171 and the second insulating layer 172. The floating gate 164 is located on the first gate 161. Wherein, the introduction of the floating gate 164 increase the gate control of the silicon thin film transistor 101, so that the silicon thin film transistor 101 can handle with higher driving voltage.

In the present embodiment, the silicon thin film transistor 101 further comprises a second metal layer 19. The second metal layer 19 is formed from a part of the first drain 182. The second metal layer 19, the etch stop layer 17, and the first metal layer 162 form the capacitor 103. Preferably, the first metal layer 162 is located on the polysilicon layer 13. The second metal layer 19 is opposite to the first metal layer 162. Those skilled in the art will understand, in the other embodiment, the second metal layer 19 is formed from a part of the first source 181. At this time, the second metal layer 19 is located at the side of the first gate 161 away from the second gate 163, and the second metal layer 19 is opposite to the first metal layer 162.

In the present embodiment, the capacitor 103 and the silicon thin film transistor 101 are overlapping arrangement, which greatly increases the aperture ratio of the bottom emitting OLED. Because the first metal layer 162, first gate 161, and the second gate 163 of the lower substrate of the capacitor 103 use the same mask process, and the second metal layer 19 and the first drain 182 of the upper substrate of the capacitor 103 use the same mask process, the manufacturing process of the capacitor 103 in the thin film transistor array substrate 10 is easier, which reduce production costs.

Those skilled in the art can understand, the present embodiment uses two different types of transistors, i.e. the silicon thin film transistor 101 and the oxide semiconductor transistor 102, to drive OLED display. Comparing with the existing technology, the carrier mobility values of the oxide in the oxide semiconductor transistor 102 is not high, so the off-state current is small, thus making the design conditions of W/L broader, which can increase the aperture ratio of the bottom emitting OLED under smaller gate length value (L value), i.e. a thin film transistor smaller size.

Figure 2:
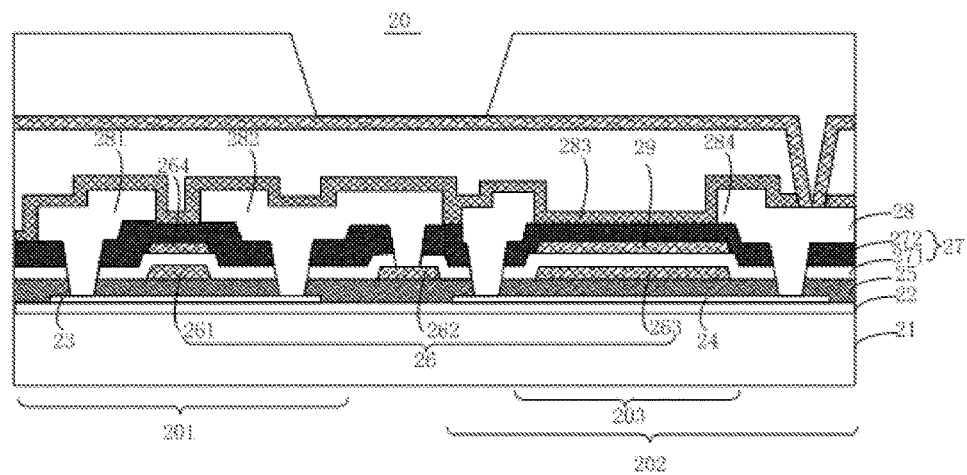
FIG. 2 is a schematic structure of the thin film transistor array substrate according to the second embodiment of the present disclosure.

FIG. 2 is a schematic structure of the thin film transistor array substrate according to the second embodiment of the present disclosure. As shown in FIG. 2, the thin film transistor array substrate 20 comprises a substrate 21, a silicon thin film transistor 201 formed on the substrate 21, an oxide semiconductor transistor 202, and a capacitor 203.

Wherein, the silicon thin film transistor 201 and the oxide semiconductor transistor 202 have a top gate structure. The oxide semiconductor transistor 202 and the capacitor 203 are overlapping arrangement.

Specifically, the thin film transistor array substrate 20 sequentially comprises a substrate 21, a buffer layer 22, a polysilicon layer 23, a semiconductor oxide layer 24, a gate insulating layer 25, a gate metal layer 26, a etch stop layer 27, and a source-drain metal layer 28.

The buffer layer 22 is provided on the substrate 21. The polysilicon layer 23 and the semiconductor oxide layer 24 are provided and spaced on the buffer layer 22. The gate insulating layer 25 covers the polysilicon layer 23 and the semiconductor oxide layer 24.

The gate metal layer 26 is provided on the gate insulating layer 25. Wherein, the gate metal layer 26 comprises a first gate 261, a first metal layer 262, and a second gate 263 provided and spaced on the gate insulating layer 25. The first gate 261, the first metal layer 262, and the second gate 263 are formed using the same mask process. Wherein, the first gate 261 is located on the polysilicon layer 23, the second gate 263 is located on the semiconductor oxide layer 24.

The etch stop layer 27 covers the first gate 261, the first metal layer 262, and the second gate 263. Wherein, the etch stop layer 27 comprises a first insulating layer 271 and a second insulating layer 272 provided by stacking. The source-drain metal layer 28 is provided on the etch stop layer 27. The source-drain metal layer 28 comprises a first source 281, a first drain 282, a second source 283, and a second drain 284. Wherein, the first source 281 and the first drain 282 are respectively contacted with the polysilicon layer 23, the second source 283 and the second drain 284 are respectively contacted with the semiconductor oxide layer 24.

In the present embodiment, the polysilicon layer 23, the gate insulating layer 25, the first gate 261, the etch stop layer 27, the first source 281, and the first drain 282 form the silicon thin film transistor 201; the semiconductor oxide layer 24, the gate insulating layer 25, the second gate 263, the etch stop layer 27, the second source 283, and the second drain 284 form the oxide semiconductor transistor 202.

In the present embodiment, preferably, the first metal layer 262 is located between the polysilicon layer 23 and the semiconductor oxide layer 24, the first metal layer 262 is contacted with the first drain 282.

Preferably, in order to improve the gate control of the silicon thin film transistor 201, the silicon thin film transistor 201 further comprises a floating gate 264. The floating gate 264 is provided between the first insulating layer 271 and the second insulating layer 272. The floating gate 264 is located on the first gate 261. Wherein, the introduction of the floating gate 264 increase the gate control of the silicon thin film transistor 201, so that the silicon thin film transistor 201 can handle with higher driving voltage.

In the present embodiment, the thin film transistor array substrate 20 further comprises a third metal layer 29. In the present embodiment, the third metal layer 29 is provided between the first insulating layer 271 and the second insulating layer 272. The third metal layer 29 is located on the second gate 263. The second gate 263, the first insulating layer 271, and the third metal layer 29 form the capacitor 203.

In the present embodiment, the capacitor 203 and the oxide semiconductor transistor 202 are overlapping arrangement, which greatly increases the aperture ratio of the bottom emitting OLED. Because the second gate 263 is used as the lower substrate of the capacitor 203, and the third metal layer 29 of the upper substrate of the capacitor 103 and the floating gate 264 in the silicon thin film transistor 201 use the same mask process, the manufacturing process of the capacitor 203 in the thin film transistor array substrate 20 is easier, which reduce production costs. Moreover, the introduction of the third metal layer 29 increase the gate control of the silicon thin film transistor 202, so that the silicon thin film transistor 202 can handle with higher driving voltage.

Figure 3:
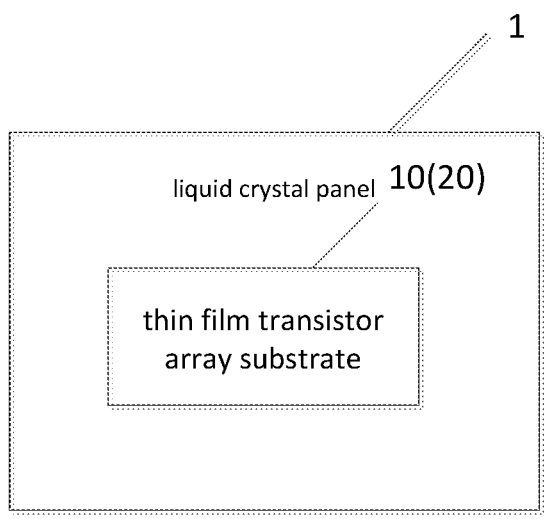
FIG. 3 is a schematic structure of the liquid crystal panel according to the embodiment of the present disclosure.

FIG. 3 is a schematic structure of the liquid crystal panel according to the embodiment of the present disclosure. As shown in FIG. 3, the liquid crystal panel 1 comprises the thin film transistor array substrate 10 or the thin film transistor array substrate 20 mentioned above.

The benefits of the present disclosure are as follows. Distinguish from the prior art, the thin film transistor array substrate and the liquid crystal panel according to the present disclosure comprises a substrate, a silicon thin film transistor formed on the substrate, an oxide semiconductor transistor, and a capacitor. Wherein, the silicon thin film transistor and the oxide semiconductor transistor have a top gate structure, which is compatible with the manufacturing process of the silicon thin film transistor and the oxide semiconductor transistor, so that it can reduce the use frequency of the photoresist mask, and then reduce the production cost of the thin film transistor array substrate. In addition, the capacitor and the silicon thin film transistor or the capacitor and the oxide semiconductor transistor are overlapping arrangement, which can greatly increase the aperture ratio of the bottom emitting OLED.

Embodiments of the present disclosure have been described, but not intending to impose any unduly constraint to the appended claims. Any modification of equivalent structure or equivalent process made according to the disclosure and drawings of the present disclosure, or any application thereof, directly or indirectly, to other related fields of technique, is considered encompassed in the scope of protection defined by the claims of the present disclosure.

What is claimed is:

1. A thin film transistor array substrate, comprising: a substrate, a silicon thin film transistor formed on the substrate, an oxide semiconductor transistor, and a capacitor; the silicon thin film transistor and the oxide semiconductor transistor having a top gate structure; the capacitor and the silicon thin film transistor or the capacitor and the oxide semiconductor transistor being overlapping arrangement;
wherein, the thin film transistor array substrate comprises:
a polysilicon layer and a semiconductor oxide layer provided and spaced on the substrate;
a gate insulating layer covering the polysilicon layer and the semiconductor oxide layer;
a first gate, a first metal layer, and a second gate provided and spaced on the gate insulating layer, the first gate being provided on the polysilicon layer, the second gate being provided on the semiconductor oxide layer;
an etch stop layer covering the first gate, the first metal layer, and the second gate, the etch stop layer comprising a first insulating layer and a second insulating layer provided by stacking;
a source-drain metal layer provided on the etch stop layer, the source-drain metal layer comprising a first source, a first drain, a second source, and a second drain, the first source and the first drain being respectively contacted with the polysilicon layer, the second source and the second drain being respectively contacted with the semiconductor oxide layer;
wherein, the polysilicon layer, the gate insulating layer, the first gate, the etch stop layer, the first source, and the first drain form the silicon thin film transistor; the semiconductor oxide layer, the gate insulating layer, the second gate, the etch stop layer, the second source, and the second drain form the oxide semiconductor transistor;
wherein, the silicon thin film transistor further comprises a floating gate;
wherein, the floating gate is provided between the first insulating layer and the second insulating layer, the floating gate is located on the first gate;
wherein, the first gate and the second gate are formed using the same mask process.

2. The thin film transistor array substrate as claimed in claim 1, wherein the thin film transistor array substrate comprises a second metal layer, the second metal layer is formed from a part of the first drain;
wherein, the first metal layer is located on the polysilicon layer;
wherein, the first metal layer, the etch stop layer, and the second metal layer form the capacitor.

3. A thin film transistor array substrate, comprising: a substrate, a silicon thin film transistor formed on the substrate, an oxide semiconductor transistor, and a capacitor; the silicon thin film transistor and the oxide semiconductor transistor having a top gate structure; the capacitor and the silicon thin film transistor or the capacitor and the oxide semiconductor transistor being overlapping arrangement;
wherein the thin film transistor array substrate comprises:
a polysilicon layer and a semiconductor oxide layer provided and spaced on the substrate;
a gate insulating layer covering the polysilicon layer and the semiconductor oxide layer;
a first gate, a first metal layer, and a second gate provided and spaced on the gate insulating layer, the first gate being provided on the polysilicon layer, the second gate being provided on the semiconductor oxide layer;

an etch stop layer covering the first gate, the first metal layer, and the second gate, the etch stop layer comprising a first insulating layer and a second insulating layer provided by stacking;

a source-drain metal layer provided on the etch stop layer, the source-drain metal layer comprising a first source, a first drain, a second source, and a second drain, the first source and the first drain being respectively contacted with the polysilicon layer, the second source and the second drain being respectively contacted with the semiconductor oxide layer;

wherein, the polysilicon layer, the gate insulating layer, the first gate, the etch stop layer, the first source, and the first drain form the silicon thin film transistor; the semiconductor oxide layer, the gate insulating layer, the second gate, the etch stop layer, the second source, and the second drain form the oxide semiconductor transistor.

4. The thin film transistor array substrate as claimed in claim 3, wherein the silicon thin film transistor further comprises a floating gate, the floating gate is provided between the first insulating layer and the second insulating layer, the floating gate is located on the first gate.

5. The thin film transistor array substrate as claimed in claim 4, wherein the thin film transistor array substrate comprises a second metal layer, the second metal layer is formed from a part of the first drain;

wherein, the first metal layer is located on the polysilicon layer;

wherein, the first metal layer, the etch stop layer, and the second metal layer form the capacitor.

6. The thin film transistor array substrate as claimed in claim 4, wherein the thin film transistor array substrate comprises a third metal layer, the third metal layer is provided between the first insulating layer and the second insulating layer and located on the second gate;

wherein, the second gate, the first insulating layer, and the third metal layer form the capacitor.

7. The thin film transistor array substrate as claimed in claim 6, wherein the first metal layer is located between the polysilicon layer and the semiconductor oxide layer, the first metal layer is contacted with the first drain.

8. The thin film transistor array substrate as claimed in claim 6, wherein the floating gate and the third metal layer are formed using the same mask process.

9. The thin film transistor array substrate as claimed in claim 3, wherein the first gate and the second gate are formed using the same mask process.

10. The thin film transistor array substrate as claimed in claim 3, wherein the thin film transistor array substrate further comprises a buffer layer;

wherein, the buffer layer is provided on the substrate;

wherein, the polysilicon layer and the semiconductor oxide layer are provided and spaced on the buffer layer.

11. A liquid crystal panel, comprising a thin film transistor array substrate; the thin film transistor array substrate comprising: a substrate, a silicon thin film transistor formed on the substrate, an oxide semiconductor transistor, and a capacitor; the silicon thin film transistor and the oxide semiconductor transistor having a top gate structure; the capacitor and the silicon thin film transistor or the capacitor and the oxide semiconductor transistor being overlapping arrangement;

wherein the thin film transistor array substrate comprises:

a polysilicon layer and a semiconductor oxide layer provided and spaced on the substrate;

a gate insulating layer covering the polysilicon layer and the semiconductor oxide layer;

a first gate, a first metal layer, and a second gate provided and spaced on the gate insulating layer, the first gate being provided on the polysilicon layer, the second gate being provided on the semiconductor oxide layer;

an etch stop layer covering the first gate, the first metal layer, and the second gate, the etch stop layer comprising a first insulating layer and a second insulating layer provided by stacking;

a source-drain metal layer provided on the etch stop layer, the source-drain metal layer comprising a first source, a first drain, a second source, and a second drain, the first source and the first drain being respectively contacted with the polysilicon layer, the second source and the second drain being respectively contacted with the semiconductor oxide layer;

wherein, the polysilicon layer, the gate insulating layer, the first gate, the etch stop layer, the first source, and the first drain form the silicon thin film transistor; the semiconductor oxide layer, the gate insulating layer, the second gate, the etch stop layer, the second source, and the second drain form the oxide semiconductor transistor.

12. The liquid crystal panel as claimed in claim 11, wherein the silicon thin film transistor further comprises a floating gate;

wherein, the floating gate is provided between the first insulating layer and the second insulating layer, the floating gate is located on the first gate.

13. The liquid crystal panel as claimed in claim 12, wherein the thin film transistor array substrate comprises a second metal layer, the second metal layer is formed from a part of the first drain;

wherein, the first metal layer is located on the polysilicon layer;

wherein, the first metal layer, the etch stop layer, and the second metal layer form the capacitor.

14. The liquid crystal panel as claimed in claim 12, wherein the thin film transistor array substrate comprises a third metal layer, the third metal layer is provided between the first insulating layer and the second insulating layer and located on the second gate;

wherein, the second gate, the first insulating layer, and the third metal layer form the capacitor.

15. The liquid crystal panel as claimed in claim 14, wherein the first metal layer is located between the polysilicon layer and the semiconductor oxide layer, the first metal layer is contacted with the first drain.

16. The liquid crystal panel as claimed in claim 14, wherein the floating gate and the third metal layer are formed using the same mask process.

17. The liquid crystal panel as claimed in claim 11, wherein the first gate and the second gate are formed using the same mask process.

18. The liquid crystal panel as claimed in claim 11, wherein the thin film transistor array substrate further comprises a buffer layer;

wherein, the buffer layer is provided on the substrate;

wherein, the polysilicon layer and the semiconductor oxide layer are provided and spaced on the buffer layer.

* * * * *